(12) United States Patent
Yamada

(10) Patent No.: US 7,419,380 B2
(45) Date of Patent: Sep. 2, 2008

(54) WIRING BOARD, MOUNT STRUCTURE, AND METHOD FOR MANUFACTURING THE SAME

(75) Inventor: Kazuyuki Yamada, Azumino (JP)

(73) Assignee: Epson Imaging Devices Corporation (JP)

( * ) Notice: Subject to any disclaimer, the term of this patent is extended or adjusted under 35 U.S.C. 154(b) by 0 days.

(21) Appl. No.: 11/754,723

(22) Filed: May 29, 2007

(65) Prior Publication Data

US 2007/0275578 A1    Nov. 29, 2007

(30) Foreign Application Priority Data

May 29, 2006   (JP)   ............... 2006-148121
Apr. 19, 2007  (JP)   ............... 2007-110096

(51) Int. Cl.
*H01R 12/00* (2006.01)
(52) U.S. Cl. ........................... 439/65; 349/149
(58) Field of Classification Search ................. 349/149; 439/65, 67, 77
See application file for complete search history.

(56) References Cited

U.S. PATENT DOCUMENTS

| | | | |
|---|---|---|---|
| 5,612,804 A * | 3/1997 | Hara | 349/149 |
| 5,818,114 A * | 10/1998 | Pendse et al. | 257/786 |
| 5,951,304 A | 9/1999 | Wildes et al. | |
| 5,982,470 A * | 11/1999 | Nakahara et al. | 349/153 |
| 6,741,315 B1 * | 5/2004 | Uchiyama | 349/149 |
| 6,760,091 B2 * | 7/2004 | Uehara | 349/152 |
| 6,872,081 B2 * | 3/2005 | Imaoka | 439/65 |
| 6,909,488 B2 | 6/2005 | Kurasawa | |
| 7,012,664 B2 * | 3/2006 | Moon et al. | 349/139 |
| 2002/0089634 A1 * | 7/2002 | Aruga et al. | 349/149 |
| 2003/0022558 A1 * | 1/2003 | Imaoka | 439/660 |
| 2003/0160929 A1 * | 8/2003 | Kurasawa | 349/149 |
| 2003/0231275 A1 * | 12/2003 | Shirato et al. | 349/149 |

FOREIGN PATENT DOCUMENTS

| | | |
|---|---|---|
| JP | 04-369622 | 12/1992 |
| JP | 08046314 | 2/1996 |
| JP | 2003-258027 | 9/2003 |
| JP | 2003-258396 | 9/2003 |
| JP | 2006119321 | 5/2006 |

* cited by examiner

*Primary Examiner*—Ross N Gushi
(74) *Attorney, Agent, or Firm*—Lowe Hauptman Ham & Berner, LLP

(57) ABSTRACT

There is provided a wiring board including: a terminal group including a plurality of terminals arrayed along a specified array axis; and a pair of alignment marks disposed on opposite sides of the terminal group in the direction of the array axis. The alignment marks each have a first portion extending so as to intersect at an angle to the array axis. The first portions of the alignment marks and the plurality of terminals extend from the terminal group to a common phantom center point that is apart from the terminal group in the direction intersecting the array axis.

8 Claims, 6 Drawing Sheets

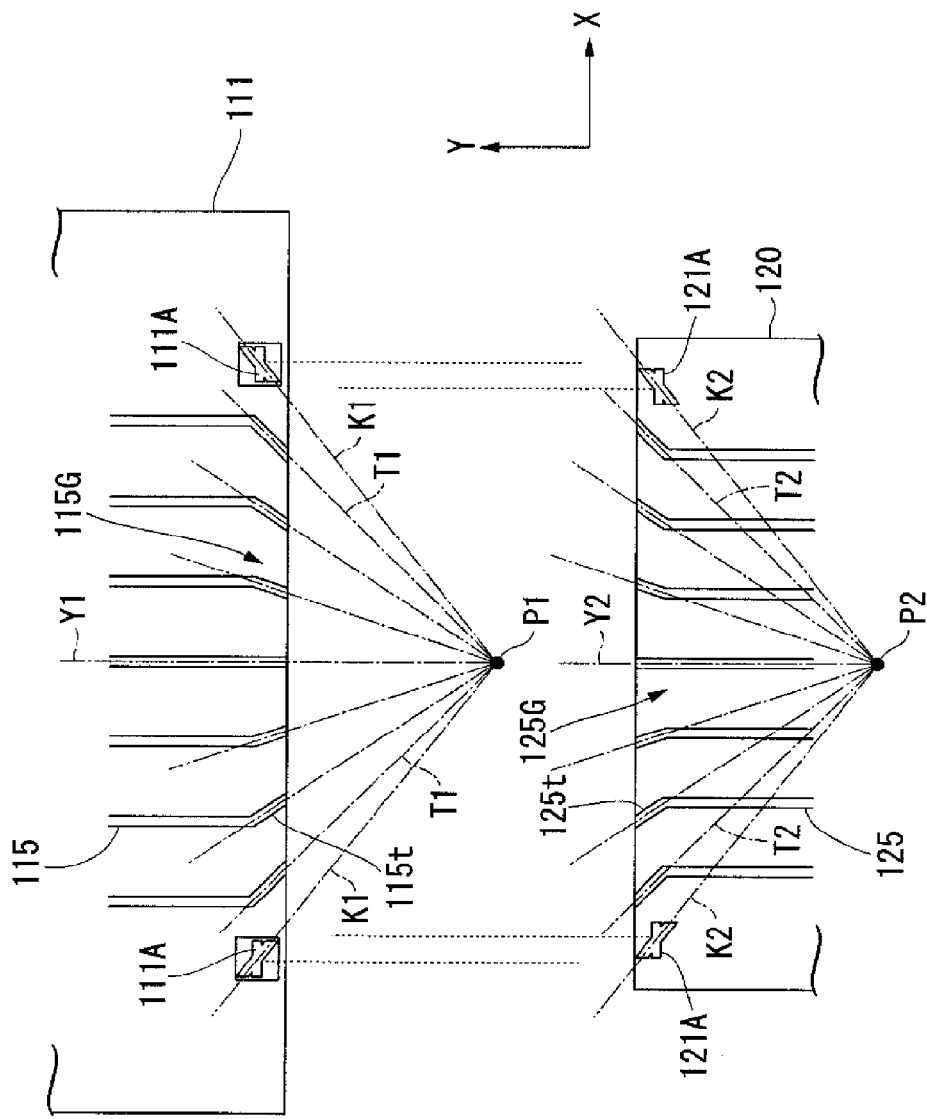

WIRING BOARD, MOUNT STRUCTURE, AND METHOD FOR MANUFACTURING THE SAME

The entire disclosure of Japanese Patent Application Nos. 2006-148121, filed May 29, 2006 and 2007-110096, filed Apr. 19, 2007 are expressly incorporated by reference herein.

BACKGROUND

1. Technical Field

The present invention relates to a wiring board and a mount structure in which the wiring board is mounted on a mounting object such as an electrooptic panel, for use in personal computers, portable phones, etc. and to a method for manufacturing the mount structure including the step of connecting the terminal groups formed on the components.

2. Related Art

Known electrooptic devices mounted to electronic devices such as portable phones, notebook computers, and TV sets include a structure having an electrooptic panel and a wiring board mounted on the electrooptic panel. When a driving circuit for driving the electrooptic panel is mounted to the panel, the wiring board supplies display data and control signals sent from the display control system of the electronic device to the electrooptic panel. When the driving circuit is not disposed on the electrooptic panel, the driving circuit is mounted on the wiring board or another circuit board connected to the wiring board. In this case, the wiring board supplies the driving signals output from the driving circuit to the electrooptic panel.

With the above structure, a plurality of input terminals is arrayed in line along a rim of the electrooptic panel, while a plurality of connecting terminals is arranged in line along a rim of the wiring board in correspondence with the input terminals. When the wiring board is mounted to the electrooptic panel, the input terminals and the connecting terminals are opposed to each other with an anisotropic conducting material in between, to which heat and pressure are applied by tools so that corresponding input terminals and connecting terminals are electrically connected. For the anisotropic conducting material, insulating resin containing dispersed conductive particles is used so that the input terminals and the connecting terminals are electrically connected via the conductive particles.

The connecting terminal array of the wiring board is disposed in proper correspondence with the input terminal array of the electrooptic panel. However, the wiring board expands or contracts significantly because it is basically made of polyimide resin, which changes the pitch of the connecting terminal array. This causes a pitch gap between the connecting terminal array and the input terminal array formed on the glass substrate that is hardly influenced by temperature changes or moisture absorption. This causes disagreement of the positions of the connecting terminal array and the input terminal array, thus posing the problem of mount failure.

Therefore, a mount structure is proposed in which the input terminals and the connecting terminals are disposed in belt shape along a plurality of lines that passes through a common point (a phantom center point) that is apart from the input terminal array and the connecting terminal array in a predetermined direction intersecting the direction of the terminal arrays, so that even if the pitch of the connecting terminal array changes to some extent because of the expansion or contraction of the wiring board, the pitches can be agreed by relatively shifting the input terminal array and the connecting terminal array in the direction in which the distance from the common point changes (for example, refer to JP-A-2003-258027).

Known methods for mounting the wiring board on the electrooptic panel in such a mount structure includes a method for aligning the electrooptic panel and the wiring board using a reference mark formed at one of the electrooptic panel and the wiring board and a scale formed at the other (for example, refer to JP-A-2003-258396).

However, the alignment method using the reference mark and the scale requires the operator to determine the amount of the expansion or contraction of the wiring board, thus posing the problem of complicated work. Moreover, since the scale is constructed of a plurality of linear patterns, extremely thin linear patterns are needed for higher alignment accuracy. Particularly, a wiring board made of polyimide or the like has the problem of low yields and high manufacturing cost because of difficulty in increasing the accuracy of the pattern of the alignment mark. This method also has the problem of low visibility and taking much time and labor for alignment work because of a large number of linear patterns formed on the scale.

SUMMARY

An advantage of some aspects of the invention is to provide a wiring board, a mount structure, and a method for manufacturing the same with ease, high alignment accuracy, and high yields of the wiring board.

A wiring board according to a first aspect of the invention includes: a terminal group including a plurality of terminals arrayed along a specified array axis; and a pair of alignment marks disposed on opposite sides of the terminal group in the direction of the array axis. The alignment marks each have a first portion intersecting at an angle to the array axis. The first portions of the alignment marks and the plurality of terminals extend from the terminal group to a common phantom center point that is apart from the terminal group in the direction intersecting the array axis.

In this structure, the central axes of the terminals and the central axes of the first portions of the alignment marks extend to the common phantom center point. Therefore, when terminals and first portions of the shapes corresponding to those of the wiring board are disposed on a mounting object, the terminals can easily be aligned using the first portions of the alignment marks as indexes even if the wiring board expands or contracts to change the pitch of the terminals. In other words, assuming that the wiring board expands or contracts isotropically, the triangle formed by the two lines connecting the first portions of the pair of alignment marks and the phantom center point and a line connecting the first portions together are always similar before and after the expansion or contraction. Therefore, when the phantom center point is agreed with the phantom center point of the triangle formed on the mounting object, the central axes of the terminals of the wiring board and the central axes of the terminals of the electrooptic panel can be agreed properly. When the phantom center points are agreed, the central axes of the first portions of the alignment marks are also agreed. Accordingly, for example, when the first portions of the alignment marks of the wiring board and the first portions of the alignment marks of the mounting object are partially agreed in the extending direction, the terminals of the wiring board and the terminals of the mounting structure can be agreed properly irrespective of the expansion or contraction of the wiring board. This method eliminates the need for the operator to determine the amount of expansion or contraction of the wiring board by himself, thus offering high general versatility and contributing to simplification of alignment work.

In this case, it is preferable that the alignment marks each have a second portion extending in parallel with the array axis.

This structure facilitates horizontal alignment (in the direction parallel to the array axis) of the wiring board and the mounting object, thus further contributing to simplification of alignment work.

It is preferable that the pair of alignment marks be arranged in axisymmetry about the symmetry axis that is perpendicular to the array axis and that passes through the phantom center point.

This structure allows more proper alignment of the wiring board and the mounting object.

It is preferable that the pitch of the plurality of terminals be different from the pitch of the terminals formed on a mounting object in consideration of the expansion and contraction when the wiring board is mounted on the mounting object.

This structure allows more proper alignment of the wiring board and the mounting object.

According to a second aspect of the invention, there is provided a mount structure in which a plurality of mounting-object-side terminals provided on a mounting object and a plurality of wiring-board-side terminals provided on a wiring board are electrically connected. The mounting object includes: a mounting-object-side terminal group including the plurality of mounting-object-side terminals arrayed along a mounting-object-side array axis; and a pair of mounting-object-side alignment marks disposed on opposite sides of the mounting-object-side terminal group in the direction of the mounting-object-side array axis. The mounting-object-side alignment marks each have a first portion extending in the direction intersecting at an angle to the mounting-object-side array axis. The first portions of the mounting-object-side alignment marks and the plurality of mounting-object-side terminals extend from the mounting-object-side terminal group to a common mounting-object-side phantom center point that is apart from the mounting-object-side terminal group in the direction intersecting the mounting-object-side array axis. The wiring board includes: a wiring-board-side terminal group including the plurality of wiring-board-side terminals arrayed along a wiring-board-side array axis; and a pair of wiring-board-side alignment marks disposed on opposite sides of the wiring-board-side terminal group in the direction of the wiring-board-side array axis. The wiring-board-side alignment marks each have a first portion extending in the direction intersecting at an angle to the wiring-board-side array axis. The first portions of the wiring-board-side alignment marks and the plurality of wiring-board-side terminals extend from the wiring-board-side terminal group to a common wiring-board-side phantom center point that is apart from the wiring-board-side terminal group in the direction intersecting the wiring-board-side array axis. The mounting-object-side array axis and the wiring-board-side array axis are parallel to each other. The mounting-object-side phantom center point and the wiring-board-side phantom center point agree with each other. The central axes of the plurality of mounting-object-side terminals and the central axes of the plurality of wiring-board-side terminals agree with each other, respectively. The central axes of the first portions of the pair of mounting-object-side alignment marks and the central axes of the first portions of the pair of wiring-board-side alignment marks agree with each other, respectively.

With this structure, even if the pitch of the mounting-object-side terminals and the pitch of the wiring-board-side terminals are displaced by the expansion or contraction of the wiring board or the mounting object, the wiring-board-side terminals and the mounting-object-side terminals can be properly agreed irrespective of the expansion or contraction of the wiring board when the first portions of the alignment marks of the wiring board and the first portions of the alignment marks of the mounting object are partially agreed in the extending direction. This method eliminates the need for the operator to independently determine the amount of expansion or contraction of the wiring board 120, thus offering high general versatility and contributing to simplification of alignment work.

In this case, it is preferable that the mounting-object-side alignment marks each have a second portion extending in parallel with the mounting-object-side array axis; the wiring-board-side alignment marks each have a second portion extending in parallel with the wiring-board-side array axis; and the central axis of the second portion of each mounting-object-side alignment mark and the central axis of the second portion of each wiring-board-side alignment mark be parallel to each other and displaced in the direction intersecting the central axes.

This structure facilitates horizontal alignment (in the direction parallel to the array axis) of the wiring board and the mounting object, thus further contributing to simplification of alignment work.

It is preferable that the mounting-object-side alignment marks be arranged in axisymmetry about a mounting-object-side symmetry axis that is perpendicular to the mounting-object-side array axis and passes through the mounting-object-side phantom center point; the wiring-board-side alignment marks be arranged in axisymmetry about a wiring-board-side symmetry axis that is perpendicular to the wiring-board-side array axis and passes through the wiring-board-side phantom center point; and the mounting-object-side symmetry axis and the wiring-board-side symmetry axis agree with each other.

This structure allows more proper alignment of the wiring board and the mounting object.

According to a third aspect of the invention, there is provided a method for manufacturing a mount structure in which a plurality of mounting-object-side terminals provided on a mounting object and a plurality of wiring-board-side terminals provided on a wiring board are electrically connected. The method includes: bringing the mounting-object-side array axis of a mounting-object-side terminal group and the wiring-board-side array axis of a wiring-board-side terminal group into agreement using second portions of mounting-object-side alignment marks and second portions of wiring-board-side alignment marks; bringing the mounting-object-side symmetry axis of the mounting-object-side terminal group and the wiring-board-side symmetry axis of the wiring-board-side terminal group into agreement by relatively moving the wiring-board-side terminal group along the wiring-board-side array axis, with the mounting-object-side array axis and the wiring-board-side array axis agreed; and bringing the central axes of first portions of the mounting-object-side alignment marks and the central axes of first portions of the wiring-board-side alignment marks into agreement by relatively moving the wiring-board-side terminal group along the wiring-board-side symmetry axis, with the mounting-object-side symmetry axis and the wiring-board-side symmetry axis agreed.

With this structure, even if the pitch of the mounting-object-side terminals and the pitch of the wiring-board-side terminals are displaced by the expansion or contraction of the wiring board or the mounting object, the wiring-board-side terminals and the mounting-object-side terminals can be properly agreed irrespective of the expansion or contraction of the wiring board when the first portions of the wiring board and the first portions of the mounting object are partially agreed in the extending direction. This method eliminates the need for the operator to independently determine the amount of expansion or contraction of the wiring board, thus offering high general versatility and contributing to simplification of alignment work.

BRIEF DESCRIPTION OF THE DRAWINGS

The invention will be described with reference to the accompanying drawings, wherein like numbers reference like elements.

FIG. 5 is a plan view of another structure of the terminals of the electrooptic panel and the wiring board.

DESCRIPTION OF EXEMPLARY EMBODIMENTS

Figure 1:
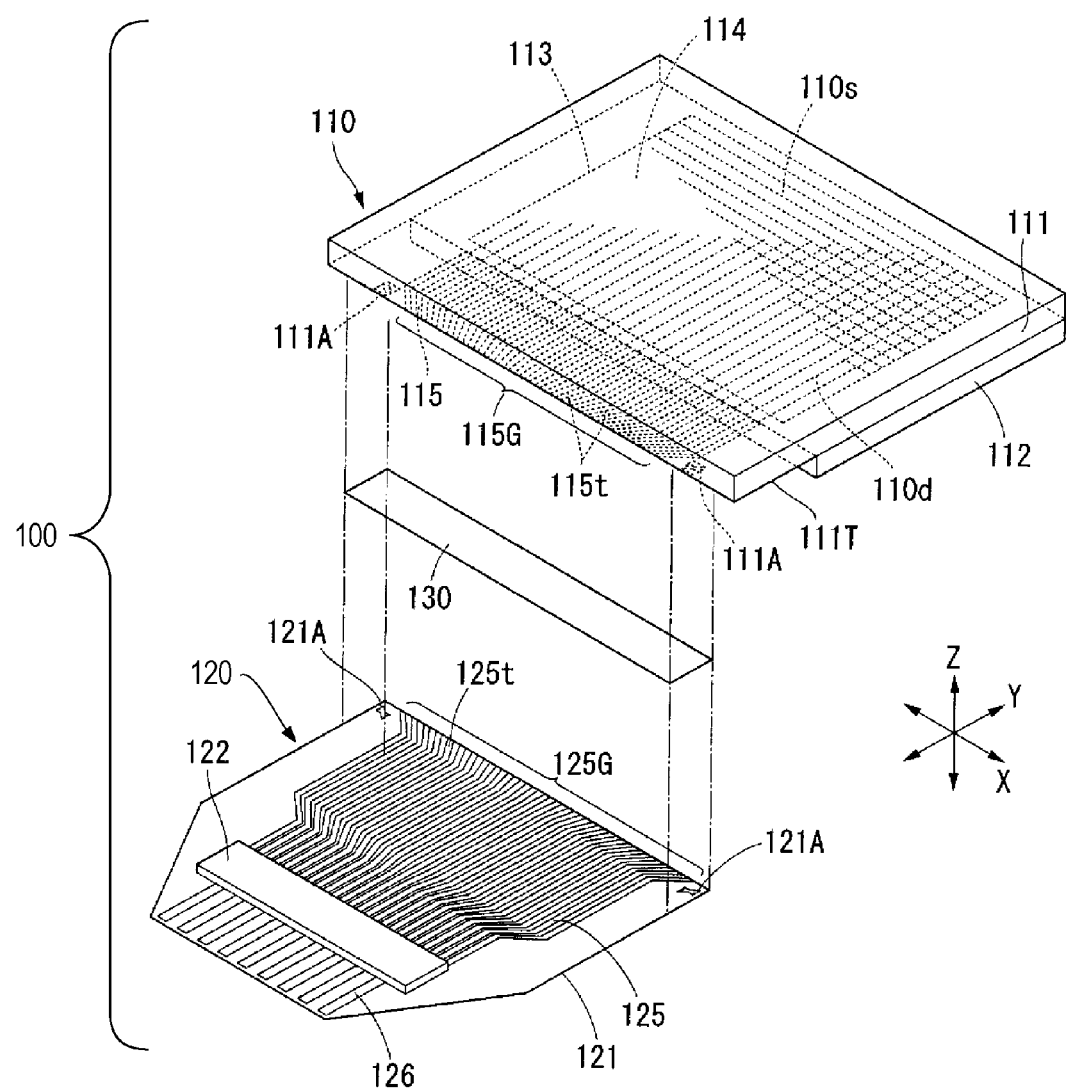
FIG. 1 is an exploded perspective view of an electrooptic device as an example of a mount structure according to an embodiment of the invention.

A preferred embodiment of the present invention will be described with reference to the drawings. However, it is to be understood that the embodiment is for illustrative purposes only and is not to be construed to limit the invention and therefore can be variously modified within the technical spirit and scope of the invention. The scale, the numbers, etc. in the drawings are different from those of the actual structure for the convenience of description.

Structure of Electrooptic Device

An electrooptic device which is an example of a mount structure equipped with a wiring board according to an embodiment of the invention will be described. FIG. 1 is an exploded perspective view of the electrooptic device according to the embodiment, which is plotted in an XYZ rectangular coordinate system. The positional relationship among the components is illustrated with reference to the XYZ rectangular coordinate system, in which the X axis indicates a specified direction in the horizontal plane, the Y axis indicates the direction perpendicular to the X axis in the horizontal plane, and Z axis indicates the direction perpendicular to the X axis and the Y axis (that is, the vertical direction).

As shown in FIG. 1, the electrooptic device 100 includes an electrooptic panel 110 which is a mounting object and a wiring board 120 that is electrically connected to the electrooptic panel 110. The electrooptic panel 110 further includes a lighting system such as a backlight and other accessories in addition to the wiring board 120 as necessary, which are not shown in FIG. 1.

The electrooptic panel 110 includes a pair of substrates 111 and 112 bonded together with a sealing member 113 in between and liquid crystal 114 which is an electrooptic material sealed in the gap of the substrates (a cell gap). Inside the sealing member 113 is disposed a plurality of wires 110s extending along the X axis and wires 110d extending along the Y axis. The portion at which the wire 110s and the wire 110d intersect corresponds to the minimum unit of display, that is, a pixel. A plurality of the pixels is arrayed in matrix form to form the whole display region. Although FIG. 1 shows wires fewer in number than actual ones with the wires 110s and 110d spaced wide, more wires are disposed in the electrooptic panel 110.

The substrate 111 has an overhanging section 111T overhanging to the outside of the substrate 112. The surface of the overhanging section 111T has wires 115 connected directly or indirectly to the wires 110s and 111d formed in the display region. At the ends of the wires 115 are provided panel-side terminals 115t (mounting-object-side terminals) coated with a transparent conductor such as indium tin oxide (ITO) or high-conductive-connection metal such as gold. The panel-side terminals 115t are arrayed along the outer rim of the overhanging section 111T to form a panel-side terminal group 115G (mounting-object-side terminal group). Panel-side alignment marks 111A (mounting-object-side alignment marks) are provided on opposite sides of the panel-side terminal group 115G. The panel-side alignment marks 111A are used to align the substrate 111 with the wiring board 120.

The wiring board 120 is connected onto the overhanging section 111T with an anisotropic conductive film (ACF) 130 or the like in between. The wiring board 120 has wires 125 made of copper or the like on the surface of a substrate 121 made of polyimide resin or the like. Various electronic parts 122 including a driving IC and a chip are mounted on the wiring board 120. The wiring board 120 also has a plurality of input terminals 126 so as to receive signals from the exterior. The input terminals 126 are connected directly or indirectly to the wires 125.

At the ends of the wires 125 are disposed wiring-board-side terminals 125t formed by the same process as the wires 125. The wiring-board-side terminals 125t are arranged along an outer rim of the substrate 121 to form a wiring-board-side terminal group 125G. Wiring-board-side alignment marks 121A are provided on opposite sides of the wiring-board-side terminal group 125G. The wiring-board-side alignment marks 121A are used to align the substrate 111 with the wiring board 120, together with the panel-side alignment marks 111A.

Figure 2:
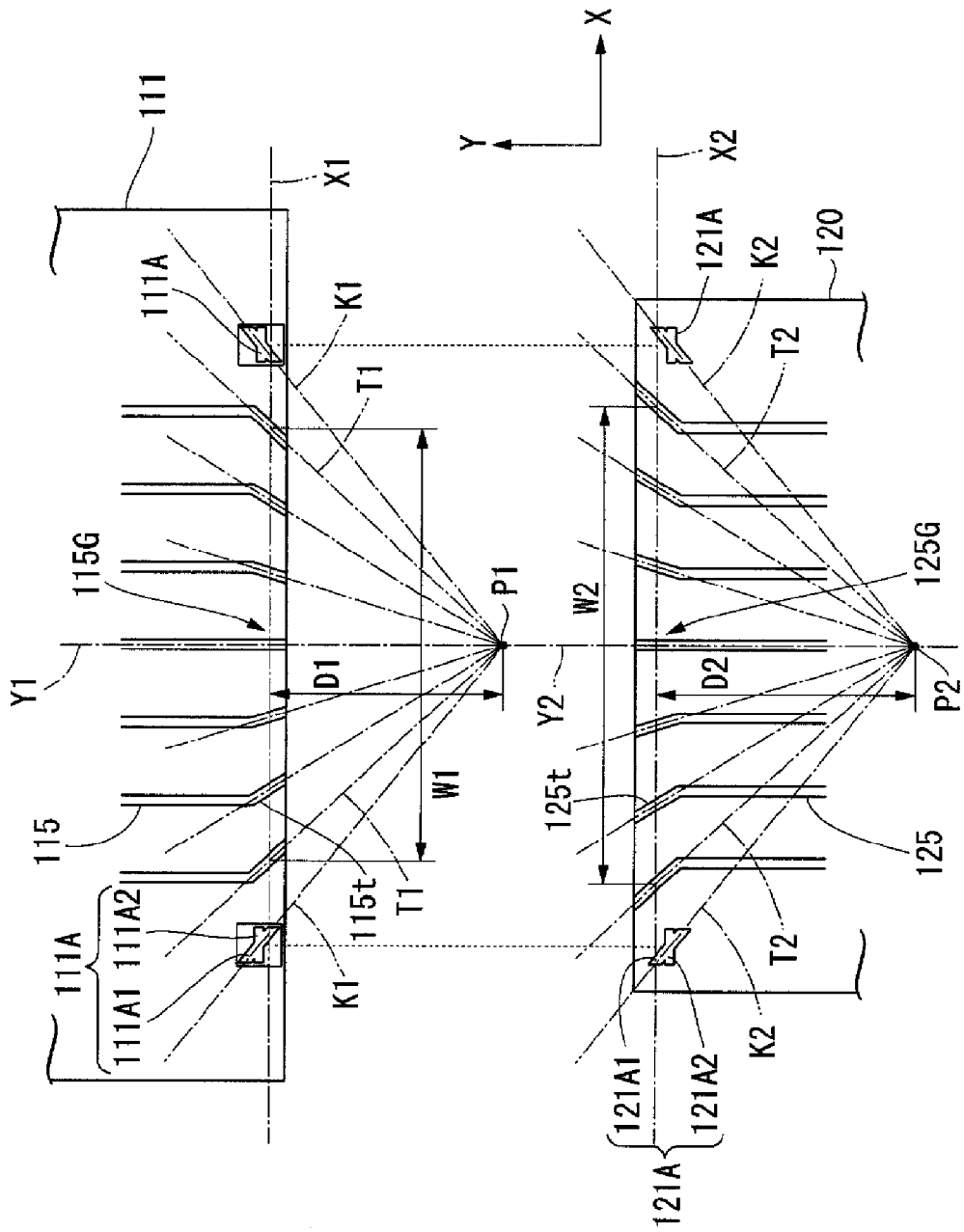
FIG. 2 is a plan view of a structure of the terminals of an electrooptic panel and a wiring board.

Referring next to FIG. 2, the structure of the panel-side terminals 115t and the wiring-board-side terminals 125t will be described. FIG. 2 shows the substrate 111 and the wiring board 120 in plan view as seen from the –Z direction in FIG. 1, in which the substrate 111 and the wiring board 120 are not yet joined. Here the "panel-side terminals 115t" indicate bent end portions of the wires 115 (at a rim of the substrate 111). However, only a wire 115 on a symmetry axis Y1 is not bent, and thus the terminal of the wire 115 is the end of the wire 115 corresponding to the other terminals. Similarly, the "wiring-board-side terminals 125t" indicates bent end portions of the wires 125 (at a rim of the wiring board 120). However, only a wire 125 on a symmetry axis Y2 is not bent, and thus the terminal of the wire 125 is the end of the wire 125 corresponding to the other terminals.

As shown in FIG. 2, the panel-side terminals 115t are arrayed along a panel-side array axis X1 (mounting-object-side array axis) parallel to the X axis. The panel-side array axis X1 agrees with the line connecting the middle points of the length of the belt-like panel-side terminals 115t. Symbol W1 indicates the width of the panel-side terminal group 115G along the panel-side array axis X1 (the distance between the middle points of the opposite panel-side terminals 115t).

The panel-side terminals 115t of the panel-side terminal group 115G extend to a common panel-side phantom center point P1 (mounting-object-side phantom center point) that is apart from the panel-side terminal group 115G in the direction (−Y) intersecting the panel-side array axis X1. The panel-side phantom center point P1 is on a panel-side symmetry axis Y1 (mounting-object-side symmetry axis) which passes through the middle point of the width W1 along the panel-side array axis X1 and which is perpendicular to the panel-side array axis X1. Symbol D1 indicates the distance from the panel-side array axis X1 to the panel-side phantom center point P1 along the panel-side symmetry axis Y1.

In the illustrated example, the panel-side terminals 115t of the panel-side terminal group 115G are disposed in axisymmetric positions about the panel-side symmetry axis Y1. However, the panel-side terminals 115t may not necessarily be disposed in axisymmetric positions about the panel-side symmetry axis Y1.

The wiring-board-side terminals 125t are arrayed along a wiring-board-side array axis X2 parallel to the X axis. The wiring-board-side array axis X2 agrees with the line connecting the middle points of the length of the belt-like wiring-board-side terminals 125t. Symbol W2 indicates the width of the wiring-board-side terminal group 125G along the wiring-board-side array axis X2 (the distance between the middle points of the opposite wiring-board-side terminals 125t).

The wiring-board-side terminals 125t of the wiring-board-side terminal group 125G extend to a common wiring-board-side phantom center point P2 that is apart from the wiring-board-side terminal group 125G in the direction (−Y) intersecting the wiring-board-side array axis X2. The wiring-board-side phantom center point P2 is on a wiring-board-side symmetry axis Y2 which passes through the middle point of the width W2 along the wiring-board-side array axis X2 and which is perpendicular to the wiring-board-side array axis X2. Symbol D2 indicates the distance from the wiring-board-side array axis X2 to the wiring-board-side phantom center point P2 along the wiring-board-side symmetry axis Y2.

In the illustrated example, the wiring-board-side terminals 125t of the wiring-board-side terminal group 125G are disposed in axisymmetric positions about the wiring-board-side symmetry axis Y2. However, the wiring-board-side terminals 125t may not necessarily be disposed in axisymmetric positions about the wiring-board-side symmetry axis Y2.

The wiring-board-side terminals 125t are arrayed in the positions corresponding to the panel-side terminals 115t. For example, the panel-side terminal group 115G and the wiring-board-side terminal group 125G are designed so as to completely agree with each other in plan view under a specified temperature and humidity. Under the environment, the widths W1 and W2 have the relationship W1=W2 and the distances D1 and D2 have the relationship D1=D2, and when the panel-side array axis X1 and the wiring-board-side array axis X2 are placed one on another and the panel-side symmetry axis Y1 and the wiring-board-side symmetry axis Y2 are placed one on another, the panel-side phantom center point P1 agrees with the wiring-board-side phantom center point P2 completely, and the phantom lines T1 (the central axes of the panel-side terminals 115t) connecting the panel-side phantom center point P1 and the panel-side terminals 115t agrees with the phantom lines T2 (the central axes of the wiring-board-side terminals 125t) connecting the wiring-board-side phantom center point P2 and the wiring-board-side terminals 125t completely.

Figure 3A:
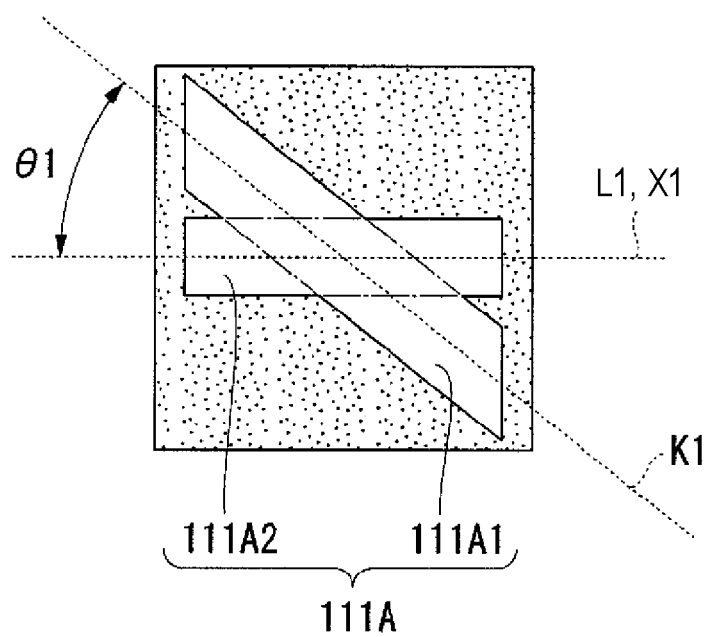
FIG. 3A is a diagram of an alignment mark of the electrooptic panel.
Figure 3B:
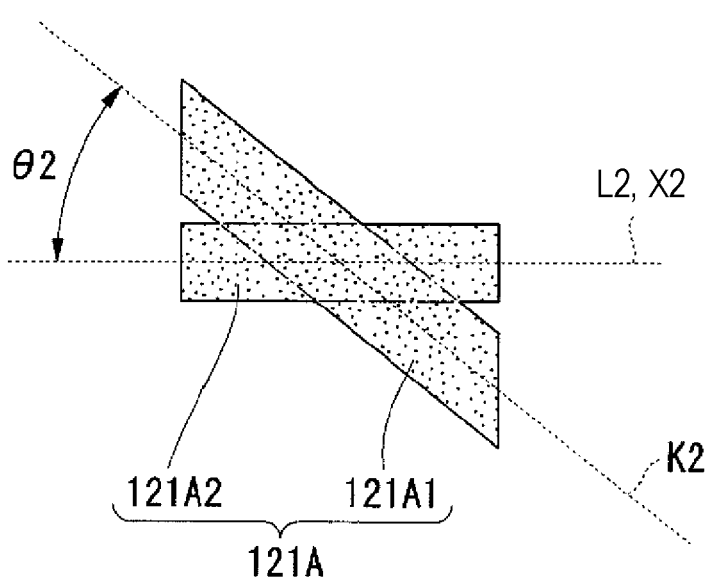
FIG. 3B is a diagram of an alignment mark of the wiring board.

Referring to FIGS. 3A and 3B, the structure of the panel-side alignment marks 111A and the structure of the wiring-board-side alignment marks 121A will be described. FIGS. 3A and 3B show the panel-side alignment mark 111A and the wiring-board-side alignment mark 121A on the left in FIG. 2.

As shown in FIG. 3A, the panel-side alignment mark 111A includes a linear first portion 111A1 extending at an angle to the panel-side array axis X1 and a linear second portion 111A2 extending in parallel with the panel-side array axis X1. These first portion 111A1 and the second portion 111A2 are groove patterns corresponding to the shape of the wiring-board-side alignment mark 121A. Specifically, as shown in FIG. 3A, the panel-side alignment mark 111A is an opening in the center of the substrate of the panel-side alignment mark 111A made of any film such as a metal film or a transparent conductive film. In place of the film, the substrate may be etched or the like to form a recess in the shape of the panel-side alignment mark 111A.

The first portion 111A1 of the panel-side alignment mark 111A intersects the panel-side array axis X1 at an angle θ1 (<90°), whose central axis K1 extends to the panel-side phantom center point P1. The central axis L1 of the second portion 111A2 of the panel-side alignment mark 111A agrees with the panel-side array axis X1. This panel-side alignment mark 111A is disposed in axisymmetric positions about the panel-side symmetry axis Y1 of the panel-side terminal group 115G in an axisymmetric pattern.

Referring then to FIG. 3B, the wiring-board-side alignment mark 121A includes a linear first portion 121A1 extending at an angle to the wiring-board-side array axis X2 and a linear second portion 121A2 extending in parallel with the wiring-board-side array axis X2. These first portion 121A1 and the second portion 121A2 are embossed patterns corresponding to the shape of the panel-side alignment mark 111A. Specifically, as shown in FIG. 3B, the wiring-board-side alignment mark 121A is an embossed pattern made of any film such as a metal film or a transparent conductive film formed on a substrate. In place of the film, the outer portion of the substrate may be etched or the like to emboss a protrusion in the shape of the wiring-board-side alignment mark 121A.

In this embodiment, the panel-side alignment mark 111A is shaped like a groove (recess), and the wiring-board-side alignment mark 121A is shaped like an embossment (protrusion). Conversely, the panel-side alignment mark 111A may be an embossment (protrusion), and the wiring-board-side alignment mark 121A may be a groove (recess).

The first portion 121A1 of the wiring-board-side alignment mark 121A intersects the wiring-board-side array axis X2 at an angle θ2 (<90°), whose central axis K2 extends to the wiring-board-side phantom center point P2. The angle θ2 agrees with the angle θ1 at which the central axis K1 of the first portion 111A1 of the panel-side alignment mark 111A intersects the panel-side array axis X1. The central axis L2 of the second portion 121A2 of the wiring-board-side alignment mark 121A agrees with the wiring-board-side array axis X2. This wiring-board-side alignment mark 121A is disposed in axisymmetric positions about the wiring-board-side symmetry axis Y2 of the wiring-board-side terminal group 125G in an axisymmetric pattern.

In this embodiment, both the panel-side alignment mark 111A and the wiring-board-side alignment mark 121A are constructed such that the first portions 111A1 and 121A1 intersect the second portions 111A2 and 121A2, respectively. However, the alignment marks 111A and 121A may not necessarily have such an intersecting shape as long as they have first portions intersecting the array axes X1 and X2 at an angle and second portions parallel to the array axes X1 and X2, respectively.

Method for Manufacturing Electrooptic Device

A method for manufacturing this electrooptic device 100 will be described with emphasis on the process of connecting the electrooptic panel 110 with the wiring board 120, particularly on the process of aligning the panel-side terminals 115t on the electrooptic panel 110 with the wiring-board-side terminals 125t on the wiring board 120.

Figure 4A:
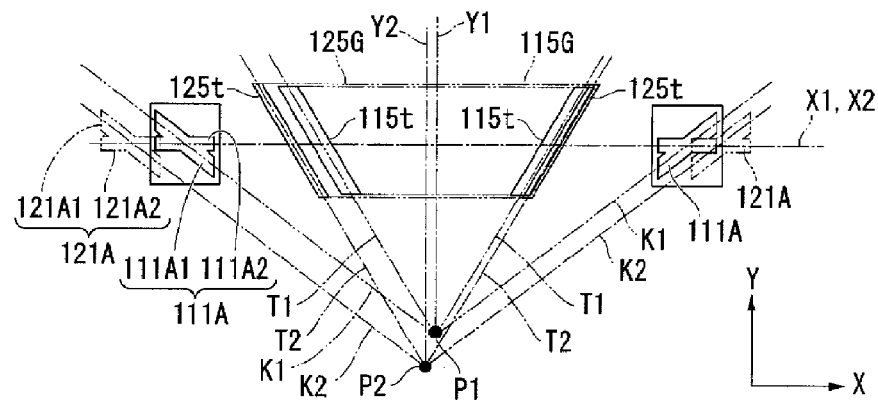
FIG. 4A is a diagram for describing a method for aligning the electrooptic device and the wiring board.
Figure 4B:
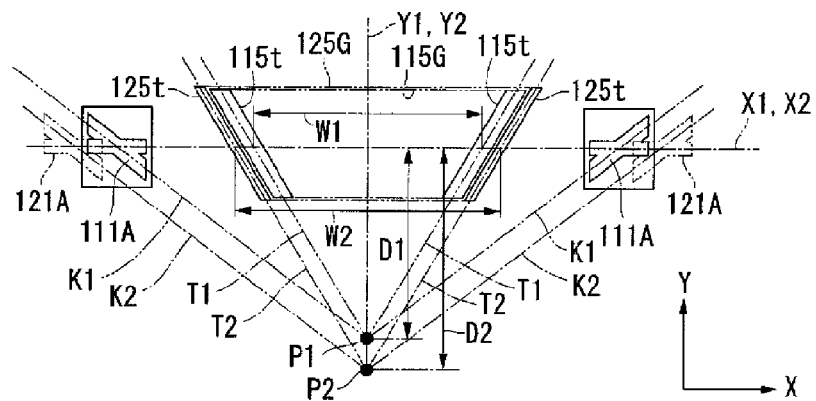
FIG. 4B is a diagram for describing the method for aligning the electrooptic device and the wiring board.
Figure 4C:
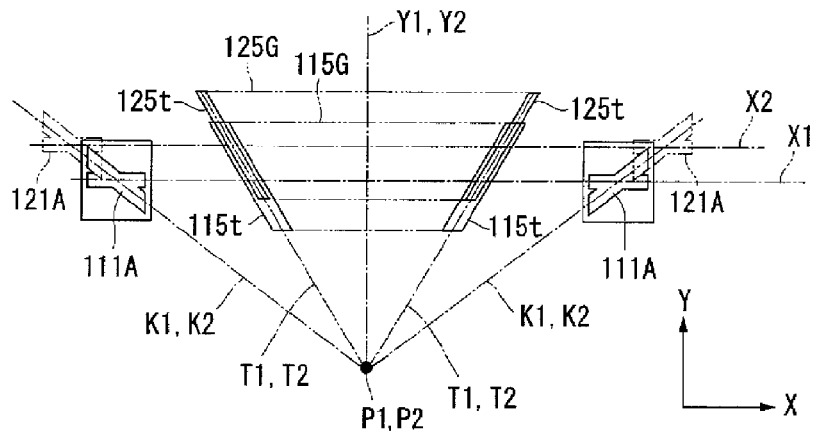
FIG. 4C is a diagram for describing the method for aligning the electrooptic device and the wiring board.

FIGS. 4A to 4C are plan views of the substrate 111 and the wiring board 120 as viewed from the −Z direction in FIG. 1. FIGS. 4A to 4C show only a pair of panel-side terminals 115t and wiring-board-side terminals 125t on opposite sides of the panel-side terminal group 115G and the wiring-board-side terminal group 125G, respectively, and show no other terminals.

Referring initially to FIG. 4A, the panel-side array axis X1 of the panel-side terminal group 115G and the wiring-board-side array axis X2 of the wiring-board-side terminal group 125G are agreed using the second portion 111A2 of the panel-side alignment mark 111A and the second portion 121A2 of the wiring-board-side alignment mark 121A. This alignment is performed by adjusting the relative position of the electrooptic panel 110 and the wiring board 120 so that the central axis of the second portion 111A2 and the central axis of the second portion 121A2 agree while the pictures of the panel-side alignment mark 111A and the wiring-board-side alignment mark 121A are being taken from the substrate 111 side by a CCD camera or the like.

Referring next to FIG. 4B, the wiring-board-side terminal group 125G is relatively moved along the wiring-board-side array axis X2, with the panel-side array axis X1 and the wiring-board-side array axis X2 agreed, so that the panel-side symmetry axis Y1 of the panel-side terminal group 115G and the wiring-board-side symmetry axis Y2 of the wiring-board-side terminal group 125G are agreed. This alignment is performed by adjusting the relative position of the electrooptic panel 110 and the wiring board 120 along the X axis while the agreement of the central axis of the second portion 111A2 and the central axis of the second portion 121A2 is maintained.

When the temperature and the humidity have changed from those at designing, the panel-side terminal group 115G and the wiring-board-side terminal group 125G do not sometimes come into agreement because of the difference in the dimensional changes of the wiring board 120 and the electrooptic panel 110 even if the panel-side array axis X1 and the wiring-board-side array axis X2 agree and the panel-side symmetry axis Y1 and the wiring-board-side symmetry axis Y2 agree. For example, when polyimide resin or the like of the wiring board 120 expands under the influence of humidity and temperature, the array width W2 of the wiring-board-side terminal group 125G becomes wider than the array width W1 of the panel-side terminal group 115G. In this case, distance D1<D2 holds generally, so that the wiring-board-side phantom center point P2 becomes farther away from the panel-side array axis X1 and the wiring-board-side array axis X2 than the panel-side phantom center point P1.

Thus, the wiring-board-side terminal group 125G is moved along the wiring-board-side symmetry axis Y2 so that all the panel-side terminals 115t of the panel-side terminal group 115G and all the wiring-board-side terminals 125t of the wiring-board-side terminal group 125G agree. In this case, the wiring-board-side terminal group 125G is moved relatively in the (+Y) direction while the central axes of the opposite second portions 111A2 of the panel-side alignment mark 111A are held in parallel with the central axes of the second portions 121A2 of the wiring-board-side alignment mark 121A (that is, while the parallelism between the panel-side array axis X1 and the wiring-board-side array axis X2 is kept). Then, the wiring-board-side terminals 125t of the wiring-board-side terminal group 125G are brought into agreement with the panel-side terminals 115t of the panel-side terminal group 115G. Properly speaking, part of the panel-side terminals 115t and part of the wiring-board-side terminals 125t are brought into partial agreement in the extending direction and into agreement in the array direction. In FIG. 4C, this state is obtained when the central axes K1 of the first portions 111A1 of the panel-side alignment marks 111A and the central axes K2 of the first portions 121A1 of the wiring-board-side alignment marks 121A come into agreement.

Even if the electrooptic panel 110 and the wiring board 120 are so designed that W1=W2 and D1=D2 hold under the environment at designing, W1 and W2 become unequal and D1 and D2 also become unequal as the environment changes. Assuming that the dimensional change of the wiring board 120 is isotropic, W1/D1=W2/D2 holds necessarily. Accordingly, the panel-side phantom center point P1 and the wiring-board-side phantom center point P2 agree when the panel-side terminal group 115G and the wiring-board-side terminal group 125G agree. Actually, the dimensional change of the wiring board 120 is not always completely isotropic. However, the panel-side phantom center point P1 and the wiring-board-side phantom center point P2 agree approximately, and the panel-side terminal group 115G and the wiring-board-side terminal group 125G also agree approximately as long as the dimensional change is not so large.

Thus, the electrooptic device 100 of this embodiment is constructed such that the central axes of the terminals and the central axes of the first portions of the alignment marks extend to the common phantom center point. Therefore, the disposition of the terminals and first portions of corresponding shapes on the wiring board 120 and the electrooptic panel 110 facilitates alignment of the terminals using the first portions as indexes even if the wiring board 120 expands or contracts to change the pitch of the wiring-board-side terminals 125t. In other words, assuming that the wiring board 120 expands or contracts isotropically, the triangle formed by the two lines connecting the first portions 121A1 of the pair of wiring-board-side alignment mark 121A to the wiring-board-side phantom center point P2 and the line connecting the first portions 121A1 together are always similar before and after the expansion or contraction. Therefore, when the phantom center point is agreed with the phantom center point of the triangle formed on the electrooptic panel 110, the central axes of the wiring-board-side terminals 125t of the wiring board 120 and the central axes of the panel-side terminals 115t of the electrooptic panel 110 can be agreed properly.

When the phantom center points are agreed, the central axes of the first portions are also agreed. Accordingly, for example, when the first portion 121A1 of the wiring board 120 and the first portion 111A1 of the electrooptic panel 110 are partially agreed in the extending direction, the wiring-board-side terminals 125t of the wiring board 120 and the panel-side terminals 115t of the electrooptic panel 110 can be agreed properly irrespective of the expansion or contraction of the wiring board 120. This method eliminates the need for the operator to determine the amount of expansion or contraction of the wiring board 120 by himself, thus offering high general versatility and contributing to simplification of alignment work.

Furthermore, the second portion parallel to the array axis is provided as an alignment mark. This facilitates horizontal alignment (in the direction parallel to the array axis) of the wiring board 120 and the electrooptic panel 110, thus further contributing to simplification of alignment work.

Although this embodiment is constructed such that the pitch of the wiring-board-side terminals 125t of the wiring board 120 and the pitch of the electrooptic panel 110 before the wiring board 120 is mounted to the electrooptic panel 110 are equal (see FIG. 2), the pitches may be different in consideration of the expansion of the wiring board 120 when it is mounted on the electrooptic panel 110. FIG. 5 shows an example in which the pitch of the wiring-board-side terminals 125t is made narrower than that of the panel-side terminals 115t in advance in consideration of the expansion of the wiring board 120 from designing. This structure allows the gap of the pitches of the terminals at mounting to be smaller than that in FIG. 2, allowing more proper alignment work.

As an alternative, the pitch of the panel-side terminals 115t may be smaller than that of the wiring-board-side terminals 125t in preparation for expansion of the substrate 111 of the electrooptic panel 110 more than that of the wiring board 120.

Electronic Device

Figure 6:
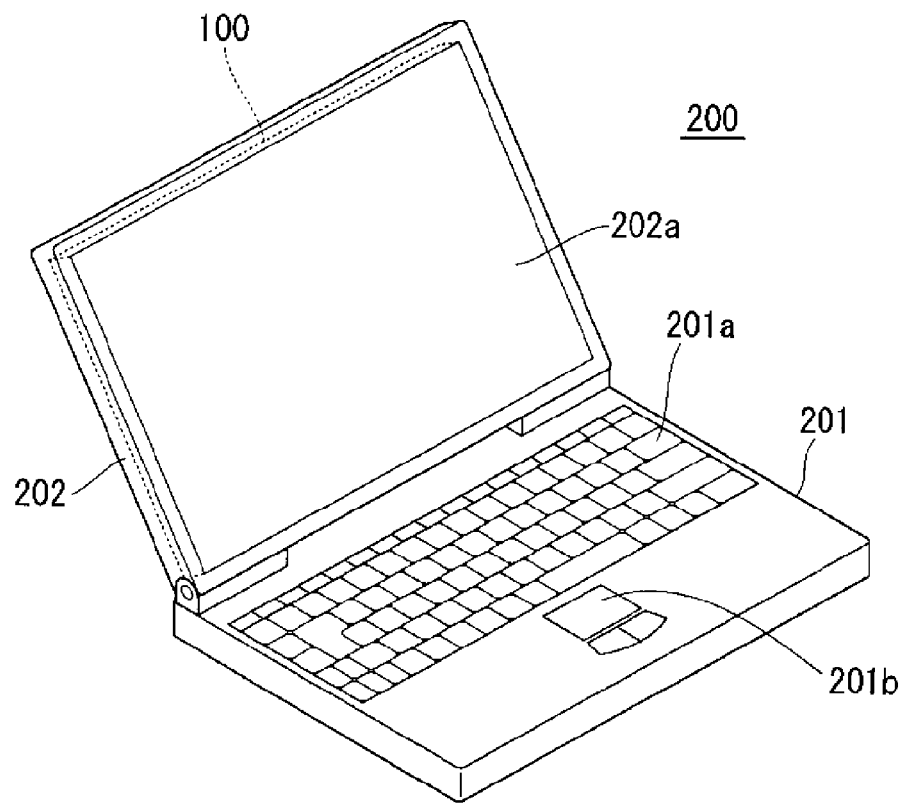
FIG. 6 is a diagram of an example of an electronic device having the mount structure of the invention.

FIG. 6 shows a notebook computer 200 which is an embodiment of an electronic device that uses the mount structure of the invention for a display. The notebook computer 200 includes a main body 201 having a plurality of operation buttons 201a and an operating section 201b and a closable display 202 connected to the main body 201 with hinges. Inside the display 202 is provided the electrooptic device 100 as a mount structure so that a desired display image can be displayed on a display screen 202a. Since the electronic device uses the above-described electrooptic device 100, it has high reliability of the connection between the electrooptic panel and the wiring board, thus achieving high display quality.

What is claimed is:

1. A wiring board comprising:
a terminal group including a plurality of terminals arrayed along a specified array axis; and
a pair of alignment marks disposed on opposite sides of the terminal group in the direction of the array axis, wherein
the alignment marks each have a first portion extending so as to intersect at an angle to the array axis; and
the first portions of the alignment marks and the plurality of terminals extend from the terminal group to a common phantom center point that is apart from the terminal group in the direction intersecting the array axis.

2. The wiring board according to claim 1, wherein the alignment marks each have a second portion extending in parallel with the array axis.

3. The wiring board according to claim 1, wherein the pair of alignment marks is arranged in axisymmetry about the symmetry axis that is perpendicular to the array axis and that passes through the phantom center point.

4. The wiring board according to claim 1, wherein the pitch of the plurality of terminals is different from the pitch of the terminals formed on a mounting object in consideration of the expansion and contraction when the wiring board is mounted on the mounting object.

5. A mount structure in which a plurality of mounting-object-side terminals provided on a mounting object and a plurality of wiring-board-side terminals provided on a wiring board are electrically connected, wherein
the mounting object comprises:
a mounting-object-side terminal group including the plurality of mounting-object-side terminals arrayed along a mounting-object-side array axis; and
a pair of mounting-object-side alignment marks disposed on opposite sides of the mounting-object-side terminal group in the direction of the mounting-object-side array axis, wherein
the mounting-object-side alignment marks each have a first portion extending in the direction intersecting at an angle to the mounting-object-side array axis; and
the first portions of the mounting-object-side alignment marks and the plurality of mounting-object-side terminals extend from the mounting-object-side terminal group to a common mounting-object-side phantom center point that is apart from the mounting-object-side terminal group in the direction intersecting the mounting-object-side array axis;
the wiring board comprises:
a wiring-board-side terminal group including the plurality of wiring-board-side terminals arrayed along a wiring-board-side array axis; and
a pair of wiring-board-side alignment marks disposed on opposite sides of the wiring-board-side terminal group in the direction of the wiring-board-side array axis, wherein
the wiring-board-side alignment marks each have a first portion extending in the direction intersecting at an angle to the wiring-board-side array axis; and
the first portions of the wiring-board-side alignment marks and the plurality of wiring-board-side terminals extend from the wiring-board-side terminal group to a common wiring-board-side phantom center point that is apart from the wiring-board-side terminal group in the direction intersecting the wiring-board-side array axis;
the mounting-object-side array axis and the wiring-board-side array axis are parallel to each other;
the mounting-object-side phantom center point and the wiring-board-side phantom center point agree with each other;
the central axes of the plurality of mounting-object-side terminals and the central axes of the plurality of wiring-board-side terminals agree with each other, respectively; and
the central axes of the first portions of the pair of mounting-object-side alignment marks and the central axes of the first portions of the pair of wiring-board-side alignment marks agree with each other, respectively.

6. The mount structure according to claim 5, wherein
the mounting-object-side alignment marks each have a second portion extending in parallel with the mounting-object-side array axis;
the wiring-board-side alignment marks each have a second portion extending in parallel with the wiring-board-side array axis; and
the central axis of the second portion of each mounting-object-side alignment mark and the central axis of the second portion of each wiring-board-side alignment mark are parallel to each other and displaced in the direction intersecting the central axes.

7. The mount structure according to claim 5, wherein
the mounting-object-side alignment marks are arranged in axisymmetry about a mounting-object-side symmetry axis that is perpendicular to the mounting-object-side array axis and passes through the mounting-object-side phantom center point;

the wiring-board-side alignment marks are arranged in axisymmetry about a wiring-board-side symmetry axis that is perpendicular to the wiring-board-side array axis and passes through the wiring-board-side phantom center point; and the mounting-object-side symmetry axis and the wiring-board-side symmetry axis agree with each other.

8. A method for manufacturing a mount structure in which a plurality of mounting-object-side terminals provided on a mounting object and a plurality of wiring-board-side terminals provided on a wiring board are electrically connected, the method comprising:

bringing the mounting-object-side array axis of a mounting-object-side terminal group and the wiring-board-side array axis of a wiring-board-side terminal group into agreement using second portions of mounting-object-side alignment marks and second portions of wiring-board-side alignment marks;

bringing the mounting-object-side symmetry axis of the mounting-object-side terminal group and the wiring-board-side symmetry axis of the wiring-board-side terminal group into agreement by relatively moving the wiring-board-side terminal group along the wiring-board-side array axis, with the mounting-object-side array axis and the wiring-board-side array axis agreed; and bringing the central axes of first portions of the mounting-object-side alignment marks and the central axes of first portions of the wiring-board-side alignment marks into agreement by relatively moving the wiring-board-side terminal group along the wiring-board-side symmetry axis, with the mounting-object-side symmetry axis and the wiring-board-side symmetry axis agreed.

* * * * *